(12) United States Patent  
Fenouillet-Beranger et al.

(10) Patent No.: US 9,275,891 B2
(45) Date of Patent: Mar. 1, 2016

(54) PROCESS FOR FABRICATING AN INTEGRATED CIRCUIT HAVING TRENCH ISOLATIONS WITH DIFFERENT DEPTHS

(71) Applicants: Commissariat à l'énergie atomique et aux énergies alternatives, Paris (FR); STEMicroelectronics (Crolles 2) SAS, Crolles (FR)

(72) Inventors: Claire Fenouillet-Beranger, Grenoble (FR); Stéphane Denorme, Crolles (FR)

(73) Assignees: Commissariat a l'energie atomique et aux energies alternatives, Paris (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/904,194

(22) Filed: May 29, 2013

(65) Prior Publication Data
US 2013/0323903 A1    Dec. 5, 2013

(30) Foreign Application Priority Data

May 29, 2012    (FR) ...................................... 12 54933

(51) Int. Cl.
*H01L 21/76*    (2006.01)
*H01L 21/762*   (2006.01)
(Continued)

(52) U.S. Cl.
CPC .... *H01L 21/76224* (2013.01); *H01L 21/76229* (2013.01); *H01L 21/76283* (2013.01); *H01L 21/84* (2013.01); *H01L 27/1203* (2013.01)

(58) Field of Classification Search
CPC ...................... H01L 21/76224; H01L 27/1203; H01L 21/76283; H01L 21/76229

USPC ......................................................... 438/424
See application file for complete search history.

(56) References Cited

U.S. PATENT DOCUMENTS 6,348,394 B1 *  2/2002  Mandelman et al. ......... 438/424
7,307,318 B2 * 12/2007  Iwamatsu et al. ............ 257/347
8,058,158 B2 * 11/2011  Bourdelle et al. ............ 438/517
(Continued)

FOREIGN PATENT DOCUMENTS

EP          2400548         12/2011

OTHER PUBLICATIONS

Khater et al., "FDSOI CMOS with dielectrically-isolated back gates and 30nm Lg High-k/Metal gate"; XP002609609, Symposium on VLSI Technology Digest of Technical Papers, 43-44 (2010).

*Primary Examiner* — Reema Patel
*Assistant Examiner* — Syed Gheyas
(74) *Attorney, Agent, or Firm* — Occhiuti & Rohlicek LLP

(57) ABSTRACT

A process for fabricating an integrated circuit includes, in a stack of layers including a silicon substrate overlaid with a buried insulating layer overlaid with a silicon layer, etching first trenches into the silicon substrate, depositing a silicon nitride layer on the silicon layer to fill the first trenches and form first trench isolations, forming a mask on the silicon nitride layer, etching second trenches into the silicon substrate, in a pattern defined by the mask, to a depth greater than a depth of the first trenches, filling the second trenches with an electrical insulator to form second trench isolations, carrying out a chemical etch until the silicon layer is exposed, and forming a FET by forming a channel, a source, and a drain of the field effect transistor in the silicon layer.

14 Claims, 4 Drawing Sheets

(51) Int. Cl.
   *H01L 27/12*    (2006.01)
   *H01L 21/84*    (2006.01)

(56) References Cited

U.S. PATENT DOCUMENTS

| | | | |
|---|---|---|---|
| 8,652,933 B2* | 2/2014 | Parries et al. | 438/427 |
| 2003/0211702 A1* | 11/2003 | Parat et al. | 438/424 |
| 2007/0063284 A1 | 3/2007 | Kawahara et al. | |
| 2007/0066026 A1* | 3/2007 | Mao et al. | 438/424 |
| 2007/0128820 A1* | 6/2007 | Majumdar et al. | 438/369 |
| 2008/0157404 A1 | 7/2008 | Fried et al. | |
| 2011/0057287 A1 | 3/2011 | Mitsuhira et al. | |
| 2011/0115047 A1 | 5/2011 | Hebert et al. | |
| 2012/0126333 A1* | 5/2012 | Thomas et al. | 257/369 |
| 2012/0139081 A1* | 6/2012 | Zhu et al. | 257/510 |
| 2013/0334652 A1* | 12/2013 | Piper et al. | 257/506 |

\* cited by examiner

Fig. 10
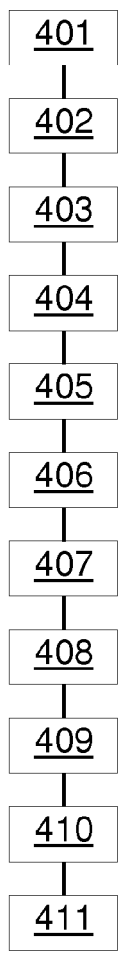
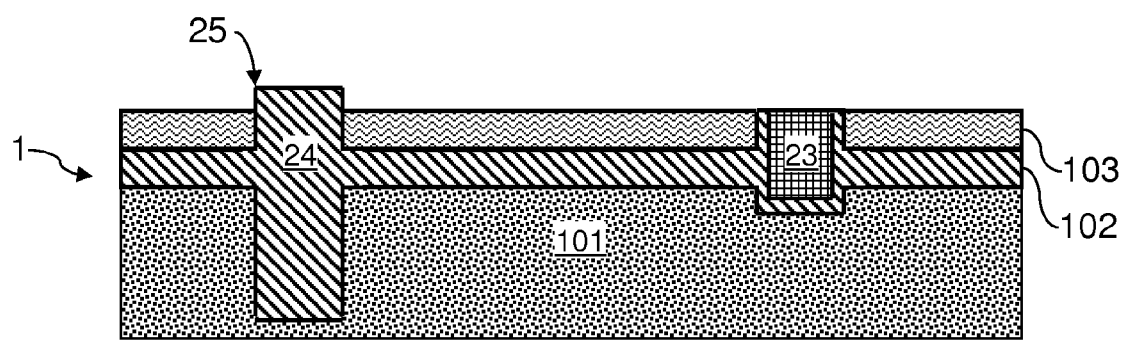
Fig. 11

PROCESS FOR FABRICATING AN INTEGRATED CIRCUIT HAVING TRENCH ISOLATIONS WITH DIFFERENT DEPTHS

RELATED APPLICATIONS

Under 35 USC 119, this application claims the benefit of the priority date of French Application No. 1254933, filed on May 29, 2012, the contents of which are herein incorporated by reference.

FIELD OF INVENTION

The invention relates to integrated circuits and in particular to integrated circuits produced on a silicon-on-insulator (SOI) substrate. SOI technology consists in separating a thin silicon layer (a few nanometers in thickness) on a silicon substrate by a relatively thick (a few tens of nanometers in thickness as a general rule) insulating layer.

BACKGROUND

Integrated circuits produced in SOI technology have a certain number of advantages. Such circuits generally have a lower power consumption for an equivalent performance. Such circuits also have lower parasitic capacitances, thereby allowing switching speeds to be improved. In addition, the phenomenon of latch up encountered in bulk technology MOS transistor may be prevented. Such circuits therefore prove to be particularly suitable for SoC or MEMS applications. It has also been observed that SOI integrated circuits are less sensitive to the effects of ionising radiation and thus prove to be more reliable in applications where such radiation may cause malfunctions, especially in space applications. SOI integrated circuits may notably comprise active SRAM memory or logic gates.

Many studies have focused on reducing the static consumption of logic gates while increasing their switching speed. Certain integrated circuits currently being developed incorporate both low-consumption logic gates and fast-access logic gates. To generate these two types of logic gates in a given integrated circuit, the threshold voltage of certain transistors of the fast-access logic gates is reduced and the threshold voltage of other transistors of the low-consumption logic gates is increased. In bulk technology, modulation of the threshold voltage level of transistors of the same type is achieved by modifying the doping level in their channels and by modulating the voltage applied to the well. However, in FDSOI (for fully depleted silicon-on-insulator) technology the doping of the channel is almost non-existent ($10^{15}$ cm$^{-3}$). Thus, the doping level of the channel of the transistors cannot vary substantially, thereby preventing the threshold voltages from being modified in this way. One solution proposed in certain studies, in order to produce transistors of the same type with different threshold voltages, is to use different gate materials in these transistors. However, in practice producing such an integrated circuit proves to be technically difficult and economically prohibitive. In order for different transistors produced in FDSOI technology to have different threshold voltages it is also known to use a biased ground plane placed between a thin insulating oxide layer (TBOX or UTBOX) and the silicon substrate. By adjusting the doping of the ground planes and their bias, a range of threshold voltages can be defined for the various transistors. It is thus possible to obtain transistors with low threshold voltages (called LVT transistors), transistors with high threshold voltages (called HVT transistors), and transistors with average threshold voltages (called SVT transistors). In order to allow the operation of the various transistors they must be electrically isolated from one another. Therefore the transistors are generally encircled by trench isolations called STIs (for "shallow trench isolations") which extend as far as the wells. In a certain number of integrated-circuit configurations, it is necessary to provide additional trench isolations having a depth smaller than the depth of the aforementioned trench isolations.

It has thus been proposed to use these shallower trench isolations to bias ground planes via lateral contacts. The fabrication processes envisaged run the risk of degrading the UTBOX layer (this layer being highly sensitive due to its small thickness), shallower trench isolations may also provide lateral protection for the UTBOX layer so as thus to eliminate the risk of a short-circuit forming between the transistor and the substrate. These shallower trench isolations pass through the UTBOX layer but do not extend to the depth of the interface between the ground planes and the wells. In practice, forming trench isolations having two different depths proves to be problematic. This is because such a structure potentially requires fabrication processes that are substantially more complex or very different from proven fabrication processes.

Moreover, document US 2011/0057287 describes an integrated circuit produced in bulk technology. This document suggests placing memory cells and peripheral circuits into two separate zones. The trench isolations have different depths in these two zones.

The fabrication process proposed in this document is the following. A lower silicon oxide film is formed by thermal oxidation on a silicon substrate. A polysilicon film is formed on the lower silicon oxide film by a CVD process. A silicon nitride film is formed on the polysilicon film, for example by CVD. This silicon nitride film is covered with an upper silicon oxide film. A photolithography mask is produced, then an anisotropic etch or chemical etch is carried out with this mask in order to form trenches to a first depth in the silicon substrate, through the various films.

A photolithography mask is produced, which mask covers the trenches intended for the memory-cell zone while leaving the trenches intended for the peripheral circuit zone uncovered. This mask and the upper silicon oxide film serve as masks for an anisotropic etch so that the trenches intended for the peripheral circuit zone are etched for longer and are therefore deeper than the masked trenches. The mask is then removed so as to expose the shallower trenches. Silicon oxide is then deposited, for example using a PECVD process, in order to fill the various trenches. Next, this silicon oxide surface deposit and the upper silicon oxide film are removed by a CMP process.

For example by means of wet etching in orthophosphoric acid and then hydrofluoric acid, the silicon nitride film, the polysilicon film and the lower silicon oxide film are removed, exposing the silicon substrate. In this way, trench isolations of different depths, formed by a silicon oxide filling step, are obtained. Conventional bulk-processing operations are then used to form transistors in the memory-cell zone of the peripheral circuits.

Here, forming trench isolations with two different depths requires additional steps, having a non-negligible impact on the fabrication cost of such an integrated circuit. Moreover, removing the photolithography etching mask from the shallower trench isolations is difficult with available processes beyond a certain depth value. Furthermore, it is difficult to envisage how such a process could be adapted to fabrication of SOI integrated circuits, due to the risk that the very thin UTBOX layer or the upper part of the trench isolations will be degraded during formation of the transistors in the active layer or during implantation of the wells or ground planes, and in particular during steps of etching with hydrofluoric acid.

SUMMARY OF THE INVENTION

The invention aims to overcome one or more of these drawbacks.

Thus, the invention relates to a process for fabricating an integrated circuit comprising steps of:
- in a stack of layers including a silicon substrate overlaid with a buried insulating layer overlaid with a silicon layer, etching first trenches into the silicon substrate;
- depositing a silicon nitride layer on the silicon layer so as to fill said first trenches and form first trench isolations;
- forming a mask on the silicon nitride layer;
- etching second trenches into the silicon substrate in a pattern defined by the mask, to a depth greater than the depth of the first trenches;
- filling the second trenches with an electrical insulator so as to form second trench isolations;
- carrying out a chemical etch until the silicon layer is exposed; and
- forming FET transistors by forming the channel, the source and the drain of these transistors in the silicon layer.

According to one variant, said buried insulating layer overlaid with the silicon layer is between 10 and 50 nm in thickness.

According to another variant, said buried insulating layer is made of silicon oxide.

According to another variant, said etching of the first trenches is continued until a depth between 10 and 100 nm under the buried insulating layer is reached.

According to yet another variant, the step of depositing a silicon nitride layer is preceded by a step of depositing a silicon oxide layer on the walls of the first trenches such that a void remains in the central part of these first trenches.

According to one variant, the silicon oxide layer deposited on the walls of the first trenches is between 1 and 4 nm in thickness.

According to yet another variant, said electrical insulator filling the second trenches is not silicon nitride.

According to another variant, said electrical insulator filling the second trenches is silicon oxide.

According to yet another variant, said chemical etch includes an etching operation carried out so that the oxide filling the second trenches forms a thickness allowance relative to the surface of the silicon layer and relative to the top of the first trench isolations.

According to one variant, the stack of layers, on which the silicon nitride layer is deposited, includes a silicon oxide layer overlaid on the silicon layer.

According to yet another variant, the step of forming an FET transistor includes:
- implanting a well under the buried insulating layer;
- implanting a ground plane between the well and the buried insulating layer; and
- forming the channel, the source and the drain of the transistor in the silicon layer plumb with the implanted well and the ground plane.

According to another variant, said trench etching steps are preceded by chemical-mechanical polishing operations.

The invention also relates to an integrated circuit, comprising:
- a stack of layers including a silicon substrate overlaid with a buried insulating layer overlaid with a silicon layer;
- FET transistors the channel, the source and the drain of which are formed in the silicon layer;
- first trench isolations placed on the periphery of the transistors, extending into the silicon substrate and filled with silicon nitride; and
- second trench isolations placed on the periphery of the transistors and extending into the silicon substrate to a depth greater than the depth of the first trench isolations, these second trench isolations being filled with an electrical insulator other than silicon nitride.

According to one variant, the integrated circuit comprises:
- wells formed in the substrate plumb with the FET transistors; and
- ground planes formed plumb with the FET transistors between the buried insulating layer and the wells, said first trench isolations not extending depthwise as far as the interface between the wells and the ground planes.

BRIEF DESCRIPTION OF THE DRAWINGS

Other features and advantages of the invention will become more clearly apparent from the non-limiting indicative description given thereof below with reference to the appended drawings, in which:

FIG. 10 is a flow chart detailing a sequence of steps implemented in an example of a fabrication process according to the invention;

FIG. 11 is a cross-sectional view of a substrate illustrating a step in a fabrication process in one variant according to the invention;

DETAILED DESCRIPTION OF THE INVENTION

FIGS. 1 to 8 are cross-sectional views of a substrate illustrating various steps in a process for fabricating an integrated circuit according to an exemplary embodiment of the invention.

Figure 1:
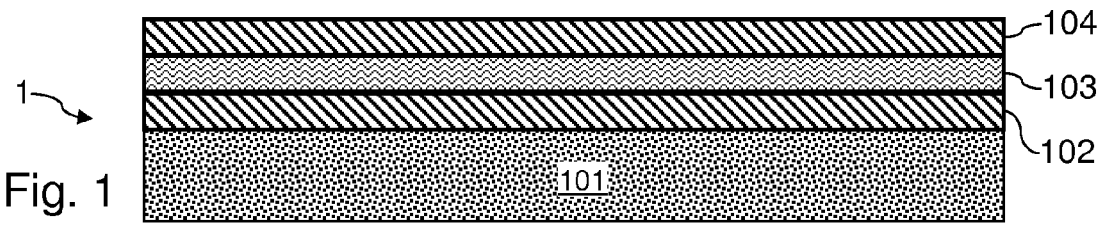
FIGS. 1 to 8 are cross-sectional views of a substrate illustrating various steps in an example of a process for fabricating an integrated circuit according to the invention.

FIG. 1 shows a silicon substrate 101, it is typically a p-doped substrate. The substrate 101 is overlaid with a buried insulating layer 102, typically made of silicon oxide. The buried insulating layer 102 is overlaid with an active silicon layer 103 in which it is desired to form the source, the drain and the channel of various transistors. In this example, the active silicon layer 103 is overlaid with an insulating layer 104 that is typically made of silicon oxide.

Figure 2:
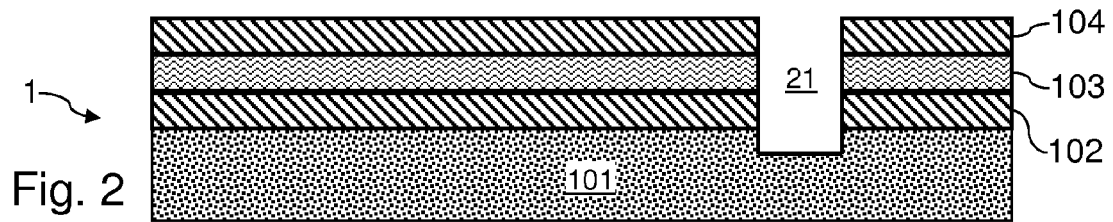

Next, a step of etching first trenches 21 into the silicon substrate 101 is carried out in order to obtain the structure illustrated in FIG. 2. This etching is carried out to a depth possibly, for example, between 10 and 100 nm below the buried insulating layer 102. This etching may typically be anisotropic etching. This etching may be carried out in a way known per se by forming beforehand photoresist masks with appropriate patterns and by applying a plasma etch step. The insulating layer 104 made of silicon oxide and the resist mask protect the lower layers during the etching step.

Figure 3:
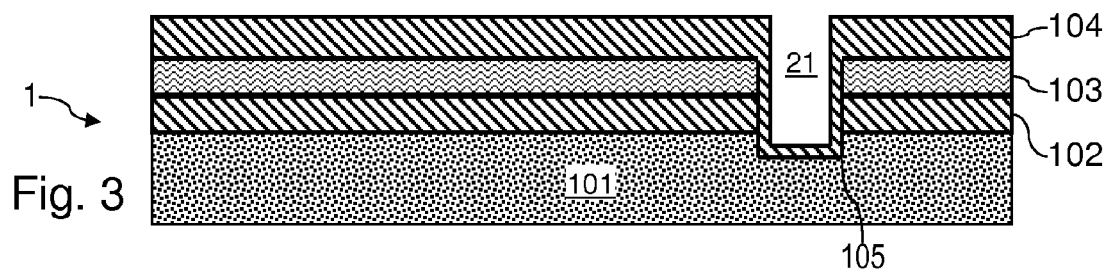
Figure 4:
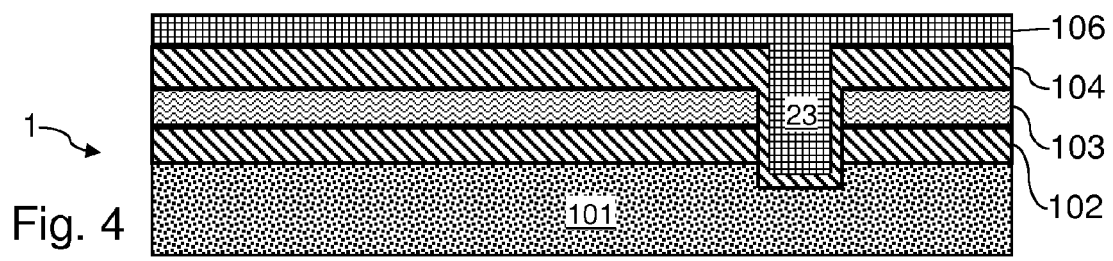

In this example, a wafer-scale deposition of an insulator is advantageously (but not necessarily) carried out in order to obtain the structure illustrated in FIG. 3. This deposited insulator forms a layer 105 covering the layer 104, the sidewalls of the trench 21 and the bottom of the trench 21. This layer 105 may, for example, be between 1 and 4 nm in thickness and preferably between 2 and 3 nm in thickness. This insulator is deposited in such a way that it does not fill the central part of the trench 21. The layer 105 is advantageously made of silicon oxide, in order to form a homogeneous structure with the layer 104 and in order to simplify the fabrication process. The silicon oxide may be formed in a way known per se using a CVD process for example. The trench 21 is advantageously at least 40 nm in width for a 20 nm technology node.

Next, a step of depositing a layer 106 of silicon nitride on the active silicon layer 103 and the insulating layer 104 is carried out. The silicon nitride is deposited so as to fill the trench 21 in order to obtain the structure illustrated in FIG. 4, which contains a first trench isolation 23. The silicon nitride layer 106 may be deposited using a CVD process. The silicon nitride deposited to form the layer 106 may be strained silicon nitride. The layer 106 will possibly, for example, have a thickness that is typically between 50 and 100 nm along the surface.

Figure 5:
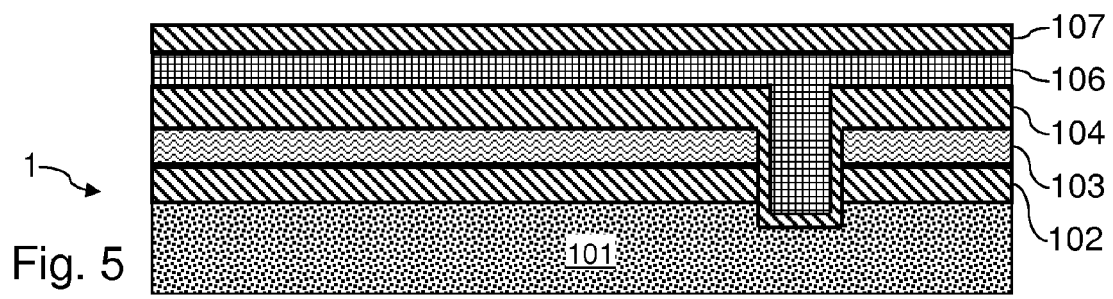

Next, a silicon oxide layer 107 is advantageously deposited on the silicon nitride layer 106 in order to obtain the structure illustrated in FIG. 5.

Figure 6:
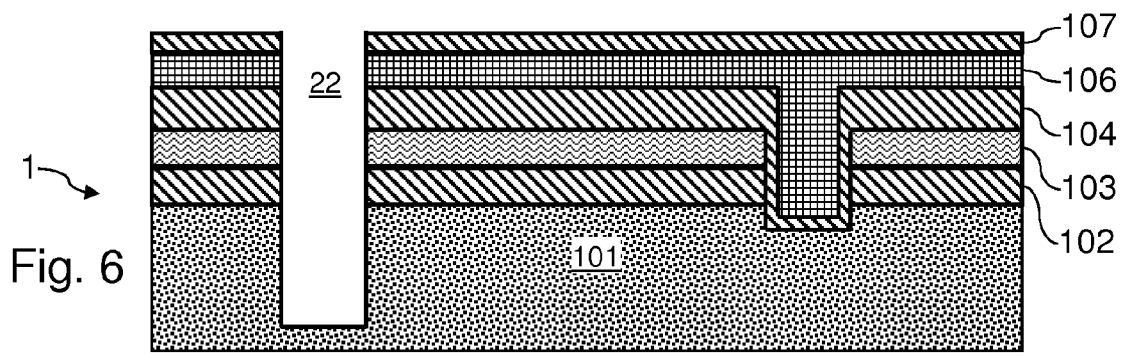
Figure 7:
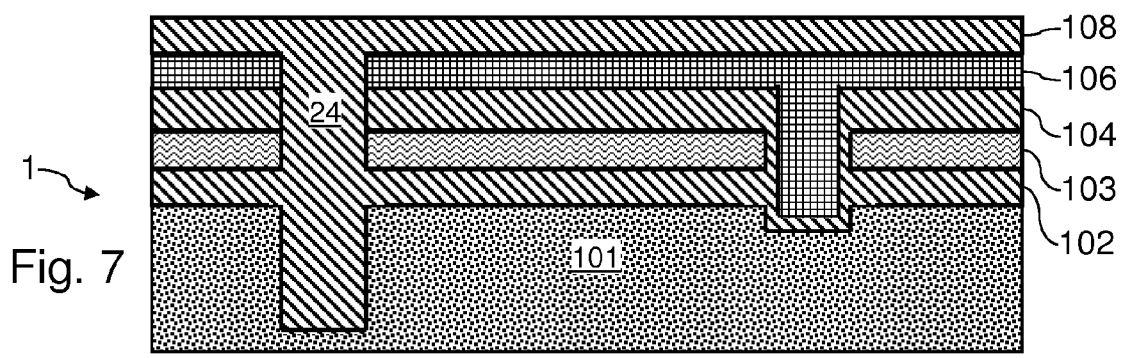

Next, a step of etching second trenches 22 into the silicon substrate 101 is carried out in order to obtain the structure illustrated in FIG. 6. This etching is carried out to a depth possibly, for example, between 30 and 300 nm below the buried insulating layer 102. In order to provide trench isolations having different depths, the trenches 22 are etched to a depth greater than the depth of the trenches 21. This etching may typically be anisotropic etching. This etching may be carried out in a way known per se by forming beforehand photoresist masks with appropriate patterns and by applying a plasma etching step. The trench 22 is advantageously at least 40 nm in width for a 20 nm technology node. The silicon oxide layer 107 and the resist mask protect the lower layers during this etching step. The silicon nitride layer 106, used to fill the trenches 21, also protects the lower layers, along with the resist mask, during this etching step. Next, the resist mask, and if required all or part of the silicon oxide layer 107, is removed. In FIG. 6 part of the silicon oxide layer 107 has been removed with the resist mask. Next, a step of filling the trench 22 with an electrical insulator is carried out in order to obtain the structure illustrated in FIG. 7, which is equipped with a second trench isolation 24. The filling step is here carried out by forming a silicon oxide layer 108. The silicon oxide layer 108 formed is here shown as coinciding with the remaining silicon oxide layer 107.

Figure 8:
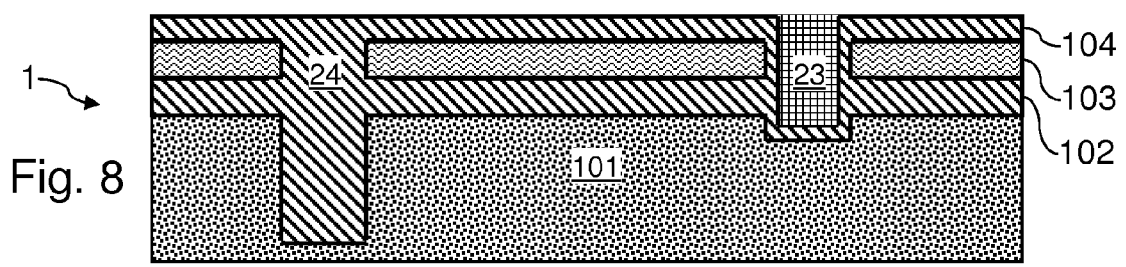

Next, a step in which the layers 106, 107 and 108 are removed is carried out in order to expose the silicon oxide layer 104 and to obtain the structure illustrated in FIG. 8.

This removing step may be carried out in a way known per se by a combination of a CMP (chemical-mechanical polishing) process and a wet etching process (for example with hydrofluoric acid).

It will be noted that FIGS. 5 to 8 illustrate a series of conventional steps in a process for forming a trench isolation in bulk technology. Therefore, the process for fabricating an integrated circuit with double depth trenches and in SOI technology according to the invention may be easily carried out using perfectly mastered technological steps.

Such a process allows trench isolations 23 and 24 to be obtained having different depths and incorporating different materials, at least in their central part, without however making the fabrication process more complex. It will be noted that the material in the central part of the trench isolations 23 is silicon nitride, which is usually used to protect lower layers during trench etching. The resistance of the trench isolations 23 to subsequent steps of the fabrication process (such as cleaning steps using hydrofluoric acid) is thus increased, thereby allowing the risk of malfunction due to possible degradation caused by erosion during these subsequent steps to be eliminated. Silicon nitride is here used both to fill the trenches 21 and to protect the lower layers during the etching of the trenches 22, during the filling of the trenches 22 or during CMP steps, thereby enabling trench isolations 23 that are less deep but also more resistant to subsequent steps in the fabrication process to be obtained without substantially increasing the cost of this fabrication process. This resistance of the trench isolations 23 especially makes it possible to provide the UTBOX layer 102 with a good level of protection, the small thickness of which makes it particularly sensitive to any deterioration.

Forming the oxide layer 105 on the walls of the trench 21 allows potential problems with the interface between the silicon nitride and the substrate 101, the UTBOX layer 102 or the active layer 103 to be avoided. The layer 105 especially prevents electrical charge carriers from being trapped at these interfaces with the trench isolation 24.

Figure 9:
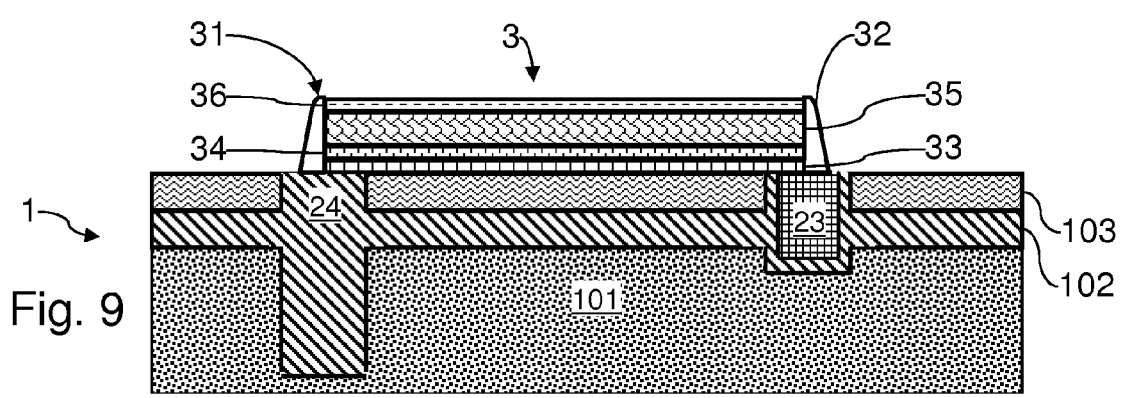
FIG. 9 is a cross-sectional view of a substrate after a transistor has been formed.

In subsequent steps known per se field-effect transistors are produced the source, the drain and the channel of which are formed in the active silicon layer 103. An example of the structure produced from these steps is illustrated in FIG. 9. These transistors may be FDSOI transistors and may comprise a biased back gate.

A transistor 3 is illustrated here. The transistor 3 comprises a gate stack 31. The gate stack 31 comprises a gate oxide 33 covering the channel of the transistor 3. The gate oxide 33 is surmounted by a metallic layer 34. The metallic layer 34 is surmounted by a polysilicon layer 35. The polysilicon layer 35 is advantageously surmounted by a protective layer 36 made of silicon nitride. The stacks 31 are bounded laterally by spacers 32. The trench isolations 23 and 24 are placed on the periphery of the transistor 3. Since the structure and the process for forming the stacks 31 of the transistor 3 are known per se they will not be described further here.

For the sake of simplicity, the ground plane, its bias-voltage terminal and the optional well in which this ground plane is implanted, are not illustrated for the transistor 3 illustrated in FIG. 9. In order to allow the threshold voltage of the transistor 3 to be modulated by adjusting the doping of its ground plane and the voltage with which it is biased, the buried insulating layer 102 is an UTBOX, this type of layer typically being between 10 and 50 nm in thickness.

FIG. 10 is a flowchart summarising all of the steps implemented in the example process described above.

In step 401a silicon substrate 101 overlaid with the buried insulating layer 102 overlaid with the active silicon layer 103 itself overlaid with the silicon oxide layer 104 is provided.

In step 402 the first trenches 21 are etched into the silicon substrate 101.

In step 403 the silicon oxide layer 105 is deposited.

In step 404 the silicon nitride layer 106 is deposited so as to fill the first trenches 21.

In step 405 the silicon oxide layer 107 is deposited on the silicon nitride layer 106.

In step 406 an etch mask is produced in a photoresist layer.

In step 407 second trenches 22 are etched into the silicon substrate 101.

In step 408 the photoresist mask is removed.

In step 409 the second trenches 22 are filled during the formation of a silicon oxide layer 108.

In step 410 the layers 106, 107 and 108 are removed exposing the silicon oxide layer 104.

In step 411 transistors are formed on the substrate obtained beforehand.

Step 410 includes the removal of the silicon oxide layers 107 and 108 and the silicon nitride layer 106. Because different materials are used to fill the central part of the trench isolations 23 and 24, it may prove to be useful for one trench isolation 24 to protrude upwards relative to the trench isolation 23 or vice versa after the silicon nitride layer 106 has been removed. In step 410, a step of wet or dry etching of the silicon nitride may for example be implemented so that the trench isolations 24 lie above the trench isolations 23, as illustrated in FIG. 11, after the silicon oxide layer 104 has been removed. The thickness allowance 25 of the trench isolation 24 thus allows the greater risk, relative to the silicon nitride, that the silicon oxide runs of degrading during any subsequent etching with hydrofluoric acid to be taken into account. It is, for example, possible to envisage providing a thickness allowance 25 of between 10 and 50 nm for the trench isolation 24 after the step of wet or dry etching of some of the nitride 23.

Figure 12:
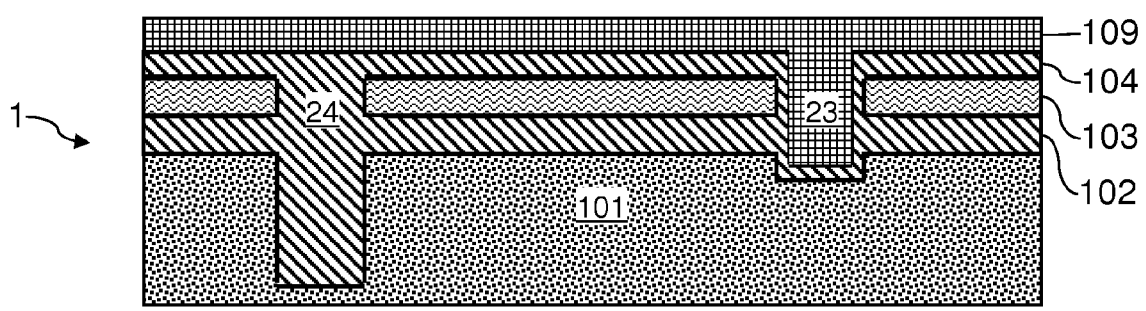
FIG. 12 is a cross-sectional view of a substrate illustrating a step in a fabrication process in another variant according to the invention.

FIG. 12 is a cross-sectional view of a substrate illustrating a step of a variant of the fabrication process according to the invention. Following removal of the layers 106, 107 and 108, in order to expose the silicon oxide layer 104, as illustrated in FIG. 8, it may prove to be advantageous to implement an additional step of depositing a silicon nitride layer 109 plumb with the silicon oxide layer 104. This variant proves to be useful when subsequent steps comprise epitaxial growth of a silicon-germanium layer.

Figure 13:
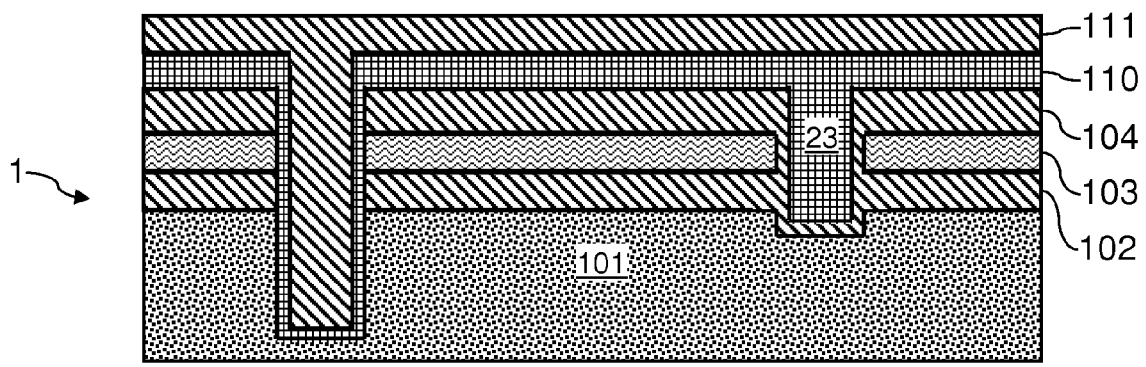
FIG. 13 is a cross-sectional view of a substrate illustrating a step in yet another variant according to the invention.

FIG. 13 is a cross-sectional view of a substrate illustrating a step in another variant of the fabrication process according to the invention. According to this process, after the silicon oxide layer 107 has been deposited on the silicon nitride layer 106, the layer 107 and the layer 106 are removed in order to expose the silicon oxide layer 104. The trench 22 is then etched into the silicon substrate 101. Next, a silicon nitride layer 110 is deposited on this silicon oxide layer 104, so as to cover the sidewalls and the bottom of the trench 22. The deposited silicon nitride layer 110 is sufficiently thin that it does not fill the central part of the trench 22. Next, a silicon oxide layer 111 is deposited in order to fill the central part of the trench 22 and thus form the trench isolation 24. The trench isolation 24 thus formed solves certain specific problems related to deep isolation of memory cells. The process may continue with step 410, the layers 110 and 111 being removed instead of the layers 108, 107 and 106.

The invention claimed is:

1. A process for fabricating an integrated circuit, said process comprising, in a stack of layers including a silicon substrate overlaid with a buried insulating layer overlaid with a silicon layer, etching first trenches into said silicon substrate, depositing a silicon nitride layer on said silicon layer so as to fill said first trenches and form first trench isolations, forming a mask on said silicon nitride layer, etching second trenches through said silicon nitride layer and into said silicon substrate, in a pattern defined by said mask, to a depth greater than a depth of said first trenches, filling said second trenches with an electrical insulator other than silicon nitride so as to form second trench isolations, carrying out a chemical etch until said silicon layer is exposed, and forming a field-effect transistor by forming a channel, a source, and a drain of said field effect transistor in said silicon layer.

2. The process of claim 1, wherein said buried insulating layer overlaid with said silicon layer is between 10 nanometers and 50 nanometers in thickness.

3. The process of claim 1, wherein said buried insulating layer is made of silicon oxide.

4. The process of claim 1, wherein etching first trenches comprises etching until a depth of between 10 nanometers and 100 nanometers under said buried insulating layer is reached.

5. The process of claim 1, further comprising, prior to depositing said silicon nitride layer, depositing a silicon oxide layer on walls of said first trenches such that a void remains in a central part of said first trenches.

6. The process of claim 5, wherein depositing said silicon oxide layer on said walls of said first trenches comprises depositing a layer between 1 nanometer and 4 nanometers thick.

7. The process of claim 1, wherein filling said second trenches with an electrical insulator so as to form second trench isolations comprises filling said second trenches with silicon oxide.

8. The process of claim 7, wherein carrying out a chemical etch until said silicon layer is exposed comprises an etching operation carried out so that said silicon oxide filling said second trenches forms a thickness allowance relative to a surface of said silicon layer and relative to a top of said first trench isolations.

9. The process of claim 1, wherein depositing a silicon nitride layer comprises depositing said silicon nitride layer on a stack of layers that includes a silicon oxide layer overlaid on said silicon layer.

10. The process of claim 1, wherein forming said field-effect transistor comprises implanting a well under said buried insulating layer, implanting a ground plane between said well and said buried insulating layer, and forming said channel, said source, and said drain of said transistor in said silicon layer, said channel being plumb with said implanted well and said ground plane.

11. The process of claim 1, further comprising, prior to etching said first trenches and etching said second trenches, carrying out chemical-mechanical polishing operations.

12. A manufacture comprising an integrated circuit, said integrated circuit comprising a stack of layers including a silicon substrate overlaid with a buried insulating layer overlaid with a silicon layer, field-effect transistors, each of which has a channel, a source, and a drain formed in said silicon layer, first trench isolations placed on a periphery of said field-effect transistors and extending into said silicon substrate, said first trench isolations having a silicon oxide layer on walls of each of said first trench isolations such that a first void remains in a central part of each of said first trench isolations, said first void being filled with silicon nitride, and second trench isolations placed on said periphery and extending into said silicon substrate to a depth greater than a depth of said first trench isolations, said second trench isolations having a silicon nitride layer on walls of each of said second trench isolations such that a second void remains in a central part of each of said second trench isolations, said second void being filled with an electrical insulator other than silicon nitride.

13. The manufacture of claim 12, wherein said integrated circuit further comprises wells formed in said substrate plumb with said field-effect transistors, and ground planes formed plumb with said field-effect transistors between said buried insulating layer and said wells, wherein said first trench isolations have a depth that falls short of reaching an interface between said wells and said ground planes.

14. A manufacture comprising an integrated circuit, said integrated circuit comprising a stack of layers including a silicon substrate overlaid with a buried insulating layer overlaid with a silicon layer, field-effect transistors, each of which has a channel, a source, and a drain formed in said silicon layer, first trench isolations placed on a periphery of said field-effect transistors and extending into said silicon substrate, said first trench isolations being filled with silicon nitride which overlays said silicon layer, and second trench isolations placed on said periphery and extending through said silicon nitride layer and into said silicon substrate to a depth greater than a depth of said first trench isolations, said second trench isolations being filled with an electrical insulator other than silicon nitride.

* * * * *